(12) United States Patent
Wang et al.

(10) Patent No.: US 7,105,895 B2
(45) Date of Patent: Sep. 12, 2006

(54) EPITAXIAL SIO$_X$ BARRIER/INSULATION LAYER

(75) Inventors: Chia-Gee Wang, Millwood, NY (US); Raphael Tsu, Cornelius, NC (US); John Clay Lofgren, Chandler, AZ (US)

(73) Assignee: Nanodynamics, Inc., New York, NY (US)

( * ) Notice: Subject to any disclaimer, the term of this patent is extended or adjusted under 35 U.S.C. 154(b) by 0 days.

(21) Appl. No.: 10/480,403

(22) PCT Filed: Jun. 14, 2001

(86) PCT No.: PCT/US01/40970

§ 371 (c)(1),
(2), (4) Date: Jun. 20, 2005

(87) PCT Pub. No.: WO02/103767

PCT Pub. Date: Dec. 27, 2002

(65) Prior Publication Data

US 2006/0003500 A1    Jan. 5, 2006

Related U.S. Application Data

(63) Continuation of application No. 09/188,586, filed on Nov. 9, 1998, now Pat. No. 6,376,337.

(51) Int. Cl.
*H01L 23/58*      (2006.01)
*H01L 27/01*      (2006.01)
*H01L 27/12*      (2006.01)
*H01L 31/0392*    (2006.01)

(52) U.S. Cl. .................. 257/347; 257/646; 257/649; 438/149; 438/787; 438/413; 438/479

(58) Field of Classification Search ................ 257/347, 257/646, 649; 438/149, 787, 479, 478, 413, 438/404
See application file for complete search history.

(56) References Cited

U.S. PATENT DOCUMENTS

| | | | |
|---|---|---|---|
| 4,088,515 A | 5/1978 | Blakeslee et al. | 148/175 |
| 4,278,474 A | 7/1981 | Blakeslee et al. | 136/249 |
| 4,379,250 A | 4/1983 | Hosoki et al. | 313/336 |
| 4,810,605 A | 3/1989 | Yoshizawa et al. | 430/58 |
| 4,839,310 A * | 6/1989 | Hollis et al. | 438/173 |
| 4,842,376 A * | 6/1989 | Braatz et al. | 349/28 |

(Continued)

FOREIGN PATENT DOCUMENTS

JP         402137315      5/1990

OTHER PUBLICATIONS

Tsu, R., et al., "Superlattice and Negative Differential Conductivity in Semiconductors." *IBM Journal of Research and Development*, vol. 14, No. 1 (Jan. 1970) pp. 61-65.

(Continued)

*Primary Examiner*—Evan Pert
*Assistant Examiner*—Victor A. Mandala, Jr.
(74) *Attorney, Agent, or Firm*—Ladas & Parry LLP

(57) ABSTRACT

A method for producing an insulating or barrier layer (FIG. 1B), useful for semiconductor devices, comprises depositing a layer of silicon and at least one additional element on a silicon substrate whereby said deposited layer is substantially free of defects such that epitaxial silicon substantially free of defects can be deposited on said deposited layer. Alternatively, a monolayer of one or more elements, preferably comprising oxygen, is absorbed on a silicon substrate. A plurality of insulating layers sandwiched between epitaxial silicon forms a barrier composite. Semiconductor devices are disclosed which comprise said barrier composite.

16 Claims, 6 Drawing Sheets

U.S. PATENT DOCUMENTS

| | | | | |
|---|---|---|---|---|
| 5,051,786 | A | 9/1991 | Nicollian et al. | 357/4 |
| 5,216,262 | A | 6/1993 | Tsu | 257/17 |
| 5,422,305 | A | 6/1995 | Seabaugh et al. | 438/480 |
| 5,644,166 | A * | 7/1997 | Honeycutt et al. | 257/754 |
| 5,733,369 | A * | 3/1998 | Yonehara et al. | 117/89 |
| 5,853,478 | A * | 12/1998 | Yonehara et al. | 117/89 |
| 5,945,686 | A | 8/1999 | Fukuda | 257/17 |
| 5,949,115 | A * | 9/1999 | Yamazaki et al. | 257/396 |
| 5,962,883 | A | 10/1999 | Hong et al. | 257/289 |
| 6,121,133 | A * | 9/2000 | Iyer et al. | 438/636 |
| 6,174,590 | B1 * | 1/2001 | Iyer et al. | 428/209 |
| 6,287,900 | B1 * | 9/2001 | Yamazaki et al. | 438/151 |
| 6,376,337 | B1 | 4/2002 | Wang et al. | 438/478 |
| 6,423,631 | B1 * | 7/2002 | Iyer et al. | 438/636 |
| 6,495,450 | B1 * | 12/2002 | Iyer et al. | 438/636 |
| 6,605,502 | B1 * | 8/2003 | Iyer et al. | 438/225 |

OTHER PUBLICATIONS

Tsu, R., et al., "Tunneling in a finite superlattice." *Applied Physics Letters*, vol. 22, No. 11, (Jun. 1, 1973) pp. 562-564.

Chang, L.L., et al., "Resonant tunneling in semiconductor double barriers." *Applied Physics Letters*, vol. 24, No. 12 (Jun. 15, 1974).

Tsu, R. et al., "Silicon quantum well with strain layer barrier." *Nature*, vol. 364, (Jul. 1, 1993) p. 19.

Tsu, R., et al., "An Epitaxial Si/SiO$_2$ Superlattice Barrier." *Solid-State Electronics*, vol. 40, Nos. 1-8, (1996) pp. 221-223.

Tsu, R., et al. "Quantum Confinement in Silicon" *Electrochemical Society Proceedngs*, vol. 97-11 (1997) pp. 341-351.

Ding, Jinli, et al., "The determination of activation energy in quantum wells." *Applied Physics Letters*, vol. 71, No. 15 (Oct. 13, 1997) pp. 2124-2126.

Distler, G.I., et al., "The Solid State; A Dislocation-free Mechanism of Growth of Reak Crystals." *Nature*, vol. 212, (Nov. 19, 1966) pp. 807-808.

Henning, C.A.O, "Orientation of Vacuum Condensed Overgrowths through Amorphous Layers" *Nature*, vol. 227, (Sep. 12, 1970) pp. 1129-1130.

Holland, O.W., et al. "Formation of ultrathin, buried oxides in Si by O$^+$ion implantation" *Applied Physics Letters*, vol. 69, No. 5 (1996) pp. 674-676.

Van Der Ziel, J.P., et al. "Optically Pumped Laser Oscillation in the 1.6-1.8 μm Region from Strained Layer Al$_{0.4}$Ga$_{0.6}$Sb/GaSb/Al$_{0.4}$Ga$_{0.6}$Sb/Double Heterostructures Grown by Molecular Beam Hetero-Epitaxy on Si Substrates" *IEEE Journal of Quantum Electronics*, vol. QE22, No. 9 (Sep. 1986) pp. 1587-1591.

Matthews, J.W., et al."Defects in Epitaxial Multilayers" *Journal of Crystal Growth*, vol. 32 (1976) pp. 265-273.

Osburn, G.C. "Strained-layer superlattices from lattice mismatched materials" *Journal of Applied Physics*, vol. 53, No. 3 (Mar. 1982) pp. 1586-1589.

Poindexter, E.H., et al. "EPR on MOS Interface States" *Insulating Films on Semiconductors*, (1981) pp. 150-160.

TSU, R., et al., "Passivation of defects in polycrystalline superlattices and quantum well structures" *Applied Physics Letters*, vol. 55, No. 18 (Oct. 30, 1989) pp. 1897-1899.

Ye, Qiu-yi, et al., "Resonant tunneling via microcrystalline-silicon quantum confinement" *Physical Review B*, vol. 44, No. 4 (Jul. 15, 1991) pp. 1806-1811.

People, R. , "Physics and Applications of Ge$_x$Si$_{1-x}$/Si Strained-Layer Heterostructures" *IEEE Journal of Quantum Electronics*, vol. QE-22, No. 9 (Sep. 1986) pp. 1696-1710.

Deppe, D.G., et al. "Room-temperature continuous operation of $p$-$n$ Al$_x$ Ga$_{1-x}$ As-GaAs quantum well heterostructure lasers grown on Si" *Applied Physics Letters*, vol. 51, No. 9 (Aug. 31, 1987) pp. 637-639.

Nakashima, T., et al. "Thickness Increment of Buried Oxide in a Simox Wafer by High-Temperature Oxidation" *Proceedings IEEE International SOI Conference 1994*, (Oct. 1994) p. 71.

Tsu, R., et al. "Silicon Epitaxy on Si(100) with Adsorbed Oxygen" *Electrochemical and Solid State Letters*, vol. 1, No. 2 (1998) pp. 80-82.

Capasso, F., et al. "Quantum Functional Devices: Resonant-Tunneling Transistors, Circuits with Reduced Complexity and Multiple-Valued Logic" *IEEE Transactions on Electron Devices*, vol. 36, No. 10 (Oct. 1989) pp. 2065-2081.

Sols, F., et al. "On the possibility of transistor action based on quantum interference phenomena"*Applied Physics Letters*, vol. 54, No. 4 (Jan. 23, 1989) pp. 350-352.

Ng, K., "Tunnel-Emitter Transistor" *Complete Guide to Semiconductor Devices*, (1995) pp. 284-316.

Sze, S.M., *VLSI Technology*, (1983) pp. 46-47, 80-85, 478-482.

Morais, J., et al., also in PH.D. Thesis, Unicamp, Brazil, 1996 (to be published).

Tsu, R., et al., *A New Type of Silicon Superlattice: Hetero-epilattice* (to be published).

Institute of Semiconductor Physics, Kiev, Ukraine: Preliminary in Litovcheko et al., JVST, B15,439 (1997).

W.S. Capinski and H.J. Maris (1997) "Thermal Conductivity of Isotopically Enriched Si" *Appl. Phys. Lett.* 71 (15), pp. 2109-2111.

K. Kawamura et al (1995) "Improvement Of Buried Oxide Quality In Low-Dose Simox Wafers By High-Temperature Oxidation" *Proceedings 1995 IEEE International SOI Conference*, pp. 156-157.

T. Nakajima et al (1994) "Buried Oxide Leakage In Low Dose Simox Materials" *Proceedings 1994 IEEE International SOI Conference*, pp. 81-82.

English Abstract of JP 402137315 dated May 25, 1990.

Tsu, R., et al. "Structure of MBE Grown Semiconductor-atomic Superlattices." *Journal of Crystal Growth* (2001) pp. 21-26.

Tsu, R., et al. "Silicon Epitaxy on Si(100) with Adsorbed Oxygen." *Electrochemical and Solid-State Letters* 1 (2) (1998) pp. 80-82.

Tsu, R. "Room Temperature Silicon Quantum Devices." *International Journal of High Speed Electronics and Systems* vol. 9, No. 1 (1998) pp. 145-163.

Tsu, R., et al. "Visible Light Emission in Silicon-Interface Adsorbed Gas Superlattices." *Mat. Res. Soc. Symp. Proc.*, vol. 358 (1995) pp. 825-832.

Tsu, R. "Si Based Green ELD:Si-Oxygen Superlattice." *Phys. Stat. Sol.* (a) 180 (2000) pp. 333-338.

Tsu, R., et al. "Visible Electroluminescence in Si/adsorbed Gas Superlattice." *SPIE*, vol. 3290 (1997) pp. 246-256.

Zhang, Q., et al. "Ultra-stable visible electroluminescence from crystalline-Si/O superlattice." *Physica E* 8 (2000) pp. 365-368.

Seo, Yong-Jin, et al. "Transport through a nine period silicon/oxygen superlattice." *Applied Physics Letters* , vol. 79, No. 6 (2001) pp. 788-790.

Tsu et al. Visible Electroluminescence in SI/Adsorbed Gas Superlattice, Proceedings of the SPIE, 1997, vol. 3290, pp. 246-256, Especially pp. 249, 251.

Tsu et al. Silicon Epitaxy on SI(100) With Adsorbed Oxygen, Electrochemical and Solid-State Letters, Apr. 1998, vol. 1, Issue 2, pp. 80-82.

\* cited by examiner

CMOS - Typical

CMOS - EpiSiO$_x$/SOI

EPITAXIAL SIO$_x$ BARRIER/INSULATION LAYER

This application is a 371 of International Application PCT/US01/40970 filed on Jun. 14, 2001, which designated the U.S., and is a continuation of 09/188,586 filed on Nov. 9, 1998, now U.S. Pat. No. 6,376,337, claims the benefit thereof and incorporates the same by reference.

The invention relates to an insulating layer/barrier for deposition on a silicon substrate and/or epitaxial silicon surface, composites and structures comprising said insulating layer/barrier, method of making the composites and structure, as well as use of the insulating layer/barrier, composites and structures in the construction of improved semiconductor devices, including but not limited to quantum well, tunneling, metal oxide, SOL, superlattice, and three dimensional architecture. The insulating layer/barrier is formed by combining silicon with one or more elements to form an insulating compound of silicon where one of the possible elements is oxygen, forming a layer of SiO$_x$ where 0<x<2.0. The insulating layer structure is produced in such a way to allow for low defect epitaxial silicon to be deposited next to the insulating layer. It further relates to forming a number of such layers sandwiched between epitaxial silicon.

DESCRIPTION OF RELATED ART

1. L. Esaki and R Tsu, *IBM J. Res. and Dev.* 14, 61 (1970).
2. R. Tsu and L. Esaki, *Appl. Phys. Lett.* 22, 562(1973); L L Chang, L. Esaki and R. Tsu, *ibid* 24 593 (1974).
3. R. Tsu, *Nature,* 364 19 (1993).
4. R. Tsu, A. Filios, C. Lofgren, D. Cahill, J. Vannostrand and C. G. Wang, *Solid-State Electronics* Vol. 40, Nos. 1–8, pp. 221–223, 1996.
5. R. Tsu, A. Filios, C. Lofgren, J. Ding, Q. Zhang, J. Morais and C. G. Wang, *Proc. 4$^{th}$ Int. Symp. "Quantum Confinement: Nanoscale Materials, Devices, and Systems"*, Edited by M. Cahay, J. P. Leburton, D. J. Lockwood, and S. Bandyopadhyay, (ECS proc. Vol. 97-11, 1997) p. 341.
6. J. Ding and R. Tsu, *Appl. Phys. Leu.,* 71, 2124 (1997).
7. J. Morais, R. Lender, and R. Tsu, to be published, also in Ph.D. Thesis, Unicamp, Brazil, 1996.
8. Inst. Of Semiconductor Physics, Kiev, Ukraine: Preliminary in Litovcheko et al., JVST, B15, 439 (1997).
9. G. L Distler, and B. B. Zvyagin, *Nature,* 212, 807–809, (1996).
10. C. A. O. Henning, *Nature,* 227, 1129–1131 (1970).
11. O. W. Holland, D. Fathy, and D. K. Sadana, *Appl. Phys. Lett.,* 69, 674 (1996).
12. P. P. van der Ziel et al., *IEEE Q. E.* 22, 1587(1982).
13. J. W. Matthews and E. E. Blakeslee, *J. Crystal. Growth,* 32, 265 (1976).
14. G. C. Osborn, *J. Appl. Phys.* 53, 1586 (1982).
15. E. H. Poindexter & P. J. Caplan, in *"Ins. Films on Semi,"* Edited by M. Schulz and M. Pensl, (Springer, Berlin 1981) p. 150.
16. E. H. Nicollian and R. Tsu, U.S. Pat. No. 5,051,786, Sep. 24, 1991; R. Tsu, E. H. Nicollian, and A. Reisman, *Appl. Phys. Lett.* 55, 1897(1989).
17. Q. Y. Ye, R. Tsu and E. H. Nicollian, *Phys. Rev. B.,* 44, 1806 (1991).
18. R. People, *IEEE Q.E.* 22, 1696(1986).
19. D. G. Deepe et al., *Appl. Phys. Lett.* 51, 637 (1987).
20. R. Tsu, U.S. Pat. No. 5,216,262 dated Jun. 1, 1993.
21. Nakashima et al, *Proc. IEEE,* 1994 *Int. SOI Conf.,* 1994.
22. R. Tsu, A. Filios, C. Lofgren, K. Dovidenko, and C. G. Wang, *Electrochemical & Solid-State Lett.* I (2) 80–82 (1998).

For a general review of quantum devices see:

23. F. Capasso et al. *IEEE, Transaction on Electron Devices* 36, 2065 (1989).
24. F. Sols et al., *Appl. Phys. Lett.* 54 350(1989).
25. Kwok Ng, *Complete Guide to Semiconductor Devices,* McGraw Hill, 1995.
26. S. M. Sze, *VLSI Technology,* McGraw-Hill, 1983.

the disclosure of each being incorporated herein by reference.

Silicon dioxide (SiO$_2$) has been used for many years as an insulating material in semiconductors. It has excellent insulating properties and provides a potential barrier typically of 3.2 eV. However, when SiO$_2$ is grown adjacent to silicon, there is a high mismatch between monocrystalline or epitaxial silicon and the layer of SiO$_2$ resulting in accumulated stress. These stresses, and therefore strains, cause the SiO$_2$ to become amorphous preventing the subsequent growth of epitaxial layers. Monocrystalline silicon in the semiconductor industry is available in the form of thin round disks called wafers. These single crystal wafers are produced by growing single crystal ingots from molten silicon which are then sliced and polished into a final "wafer" upon which semiconductor devices and integrated circuits are manufactured. Matthews and Blakeslee[13] showed that if the thickness of the "strain" layer is thin enough so that the stored strain energy is kept below a critical value, a defect-free superlattice is possible for lattice mismatched systems and hence epitaxial silicon can proceed.

In Tsu U.S. Pat. No. 5,216,262, (20), the disclosure of which is incorporated herein by reference, making alternating thin layers of SiO$_2$ and epitaxial silicon was claimed as a way to make a barrier material adjacent to which epitaxial silicon can be grown with a low number of defects. Although such a barrier is feasible[3, 4, 22], the cost of controlling the process to precisely deposit SiO$_2$ in thin layers adjacent to epitaxial silicon in a superlattice is difficult and expensive.

Silicon On Insulator (SOI)

Current silicon devices are limited by inherent parasitic circuit elements due primarily to junction capacitance and leakage currents. These problems can be addressed for silicon by fabricating silicon devices in a thin epitaxial layer on top of a buried insulator layer, the so-called silicon on insulator (SOI) approach. This approach allows devices to he isolated from the substrate as well as from each other, eliminating the need for structures such as guard-rings, isolation junctions, etc.[26]

A number of technologies have been developed to place an insulating layer under a layer of low defect silicon which forms the substrate upon which silicon devices are fabricated. This insulating layer reduces the amount of leakage current as well as the junction capacitance thus significantly improving the device performance. Advantages include substantially reduced power consumption, more efficient low-voltage operation, significantly improved speed, radiation hardening and reduced integrated circuit manufacturing costs. These characteristics make SOI wafers well-suited for many commercial applications, including cellular phones, wireless communications devices, satellites, portable and desktop computers, automotive electronics, and microwave systems.

One method of producing SOI wafers is by implanting oxygen ions below the surface of a silicon wafer in sufficient quantity to transform, with proper annealing, a layer of the silicon to silicon dioxide, while maintaining a thin layer of device quality epitaxial silicon at the surface. During implantation of the oxygen ions through the silicon surface, the surface is damaged reducing the quality of the epi-layer upon which devices are fabricated. Annealing can reduce the oxygen inclusion, however it is difficult to reduce the [0] to values below $10^{17}/cm^3$. The thickness of the insulating layer is very difficult to control due to the random nature of scattering arising from ion implantation. Also, the ion implantation equipment costs are expensive.

A second method of production is silicon-on-sapphire ("SOS"). In SOS technology, circuitry is constructed in a layer of silicon, which has been deposited on a sapphire substrate. This material has been used in the construction of radiation resistant circuits. However, there are several problems with this material, including large current conduction in the sapphire when exposed to radiation, brittleness causing breakage during integrated circuit fabrication and large mismatches between sapphire and silicon crystal structures. These problems have led to performance and manufacturability limitations.

A third method of production involves the bonding of two thin film wafers. In this approach, two bulk silicon wafers, each with a thermally grown oxide layer, are first bonded together to form a silicon/silicon dioxide/silicon wafer. Thin-film bonded wafers are constructed by bonding the two wafers and then thinning one of the two layers. Several alternatives are currently being explored across the industry to perform the subsequent thinning process—including mechanical polishing, chemical etching; plasma assisted chemical etching, bond and selective etching of porous silicon or an implant-enhanced slicing of the wafer. The bonded wafer approach has the advantage that the buried oxide can be made very uniform and thick. The top silicon layer retains its high quality, achieving uniformity in the thickness of the top silicon layer, however, has proven difficult. Also, the requirement to use two silicon wafers with complex processing has, to date, resulted in a relatively high cost structure for bonded wafers.

Quantum Wells

The p-n homojunction currently widely used in silicon devices has some serious limitations. Typical A-n homojunctions involve long range electrostatic interaction of free charges and are not abrupt. The electrostatic fields are continuous over a distance, which is significantly longer than the DeBroglie wavelength of an electron. It is a scattering dominated structure for electrons. On the other hand heterojunctions are abrupt and analogous to a waterfall where the change in potential is confined to a very short distance. Heterojunctions are the basis of the barriers formed in GaAs/AlGaAs, GaInAs/AlInAs and other so-called III/V compounds from columns 3 and 5 of the periodic chart The barriers of those heterojunctions derive from chemical bonding, and are short ranged Typically in p-n homojunctions the continuous voltage changes occur over a distance of the order of one micron. With a heterojunction this occurs over a distance on the order of 0.5 nanometers, less than one percent the p-n junction distance. As the size of transistors decrease with time, the heterojunction will be ever more important, particularly for quantum well structures.

Dr. L Esaki and Dr. R. Tsu, while working jointly at the IBM research center[1,2], envisioned a new type of man made material which could be used to form what they called superlattice barriers and quantum wells to resolve some of the difficulties of the p-n junction. In order to realize these structures in silicon, a "barrier" material is necessary that can be stacked between epitaxial device grade silicon. The present invention describes such a material.

In his patent U.S. Pat. No. 5,216,262,[20] R. Tsu proposed a way to build barriers and quantum wells with silicon and $SiO_2$, which will allow the economical implementation of quantum wells. The invention provided a quantum well structure useful for semi-conducting devices, said structure comprising two barrier regions and a thin epitaxially grown monocrystalline semiconductor material quantum well sandwiched between said barrier regions, each barrier region consisting essentially of alternate strain layers forming a superlattice, each of said layers being thinner than said quantum well and being so thin that no defects are generated. Creating $SiO_2$ in such thin layers is commercially expensive and probably not viable. The present patent describes a substitute for $SiO_2$ in this application, which will be referred to as "said barrier".

Metal Oxide Devices

The silicon MOSFET is probably the single most important structure of electronic device.[26] A layer of amorphous $SiO_2$ is typically sandwiched between a metal contact (the gate) and silicon channel region between the source and drain. The lower the interface defect density between the amorphous $SiO_2$ and epitaxial silicon, the faster is the switching speed and the less power dissipated. Because of the amorphous nature of current $SiO_2$ layers, the region of the layer near the silicon is filled with defects, reducing the switching speed of the device, apart from the more obvious problem of building epitaxially grown structure beyond the oxide barrier. In his patent U.S. Pat. No. 5,216,262[20] R. Tsu addressed this shortcoming by introducing an insulating layer consisting essentially of alternate strain layers of $SiO_2$ and Si forming a superlattice, each of said layers being so thin that no defects are generated as a result of the release of stored strain energy. By reducing the level of defects at this interface between the insulating layer and the channel region of the device the mobility is increased and performance improved. For reasons stated above forming such layers of $SiO_2$ and Si is expensive. Once again, in this application the "said barrier" described in this patent can be substituted for $SiO_2$.

Two Dimensional Semiconductor Devices

Currently silicon-based integrated circuits are limited to construction as two-dimensional devices. Once an oxide layer is deposited in a semiconductor device, there is currently no way to grow epitaxial silicon again on top of the oxide layer. Epitaxial silicon is needed if a second layer of devices is to be constructed on top of the first layer. Growing additional layers could provide significant advantages in improving heat dissipation, simplifying interconnections between devices, and significantly reducing the size of an integrated circuit, depending on the number of layers of devices stacked on top of each other, as well as, the means by which they are interconnected.

Silicon Dioxide as a Dielectric Material

When $SiO_2$ is used as an insulating layer in semiconductor devices there is a capacitance and resistance associated with such a layer. The capacitance is a function of the area of the contact surface, the thickness of the $SiO_2$ layer and the dielectric constant of the $SiO_2$ material. Currently the contact area and distance between contacts can be changed affecting the capacitance and hence the RC time constant associated with the $SiO_2$ insulating layer. However, the $SiO_2$ dielectric constant is fixed by the properties of $SiO_2$ and there is virtually no ability to change that property.

Accordingly, it is an object of the present invention to overcome the drawbacks and disadvantages of the above-described insulating layers and heterojunctions used in silicon based semiconductor devices. The present invention allows control over the dielectric constant, as well as, the thickness of said barrier.

FIRST EMBODIMENT: SI/O

The invention provides a method for the formation of a Si/adsorbed-monolayer-of-oxygen (Si/O) as the building block of a barrier to form a repeatable system—a superlattice. This Si/O building block can be grown on a silicon substrate where silicon layers are grown epitaxially adjacent to each monolayer, or less, of adsorbed oxygen where therein is formed monolayers, or less, of adsorbed oxygen sandwiched between thin epitaxially grown silicon layers. Since all transport properties depend on both the barrier height and barrier width, and since the barrier width is dictated by the Si—O—Si thickness which cannot be changed the formation of a superlattice by repeating the basic building block accomplishes the desired thickness of the barrier. A relatively thick barrier is used as an insulating layer for devices such as in the use of SOI, and thin barriers are used for most quantum devices.

Silicon growth beyond a barrier structure consisting of thin layer (typically, 1–2 nm) of silicon sandwiched between adjacent layers of adsorbed oxygen up to 100 Langmuir of exposure is epitaxial and almost free of stacking faults as determined in high resolution TEM, transmission electron microscopy (reference 22). The measured barrier height in the conduction band of a double barrier structure with 1.1 nm silicon layer sandwiched between two adsorbed monolayers of oxygen is 0.5 eV. The maximum barrier height in the conduction band is probably limited by 1.5 eV, half as large as $SiO_2$, which is 3.2 eV. The rationale is that the interface layer consisting of S/O bonds is closer to SiO rather than $SiO_2$. Since the effectiveness of a barrier depends on both the height and the width of the barrier, to increase the width the basic period, Si/adsorbed O, may be repeated to form a superlattice. A superlattice of Si/O up to nine periods shows excellent epitaxial growth of silicon beyond the superlattice structure, indicating that the major objective has already been accomplished.

The formation of the structure consists of the deposition of silicon by either MBE (Molecular Beam Epitaxy) or CVD (Chemical Vapor Deposition) onto an epitaxial silicon surface with a controlled adsorption of oxygen. The deposition temperature is generally kept below 650° C. to limit possible subsequent desorption of the adsorbed oxygen. The exposure to oxygen is at temperatures generally below 500° C. to prevent any migration or re-emission of the adsorbed oxygen. Once the superlattice is formed, silicon capping, usually greater than 4 nm in thickness, can prevent any degradation. Specifically, the structure measured here is Si Substrate/Si(1.1 nm)-O(10 L)-Si(1.1 nm)-)(10 L) . . . Si(1.1 nm)-O(10 L)/epi-Si Such a structure has exhibited the following:

The current through this superlattice has been reduced more than four orders of magnitude.

Epitaxial silicon after the superlattice is virtually free of stacking faults.

These two facts allow the replacement of SOI by this Si/O superlattice for devices with high speed including high efficiency FET's currently fabricated on SOI.

A definitive theoretical reason for the formation of epitaxy on apparently disordered adsorbed monolayer of oxygen on silicon is still lacking. It may be due to lateral growth through the "holes" in the coverage of the adsorbed oxygen. It may be due to partial screening of the silicon atomic potential by a monolayer of oxygen. More likely, it may be caused by both mechanisms. We now know a third mechanism: The oxygen monolayer at the interface of two silicon surfaces, Si—O—Si, forms an essentially lattice matched system possibly with a slight twist, resulting in a rotational strain, Subsequent silicon deposition serves to define this strain region.

SECOND EMBODIMENT: EPISIO$_x$

The invention also provides a method of introducing oxygen simultaneously during silicon deposition onto a silicon substrate to form a single insulating/barrier layer of silicon and oxygen referred to as EpiSiO$_x$ wherein $0<x<2.0$. This structure forms an epitaxial system on silicon in which epitaxial silicon, almost free of defects such as stacking faults and dislocations, can be grown beyond this EpiSiO$_x$. This system is therefore an ideal replacement of SOI presently available. As before, a relatively thick barrier is used as an insulating layer for devices as is done in SOI, and thin barriers are used for most quantum devices.

A layer of EpiSiO$_x$ has been formed with the following steps:

All depositions are below 650° C.

Oxygen is introduced during the silicon deposition.

A summary of what has been achieved:

The silicon growth beyond the EpiSiO$_x$ of thickness below 10 nm may be epitaxial with low defect densities below $10^9/cm^2$.

The thinner is the EpiSiO$_x$; the thinner is the silicon deposition beyond the structure for complete recovery. An example to make the point is for a 2 nm EpiSiO$_x$, only 4 nm of silicon is needed to recover the surface reconstruction Conversely, the thicker is the EpiSiO$_x$, the thicker is the silicon deposition necessary to recover a perfect silicon surface reconstruction—the appearance of surface reconstruction is used as a figure of merit for the recovery of epitaxy.

The following is believed to be a possible basis for the EpiSiO$_x$. The structure is all along epitaxial and fairly well matched to the silicon lattice. However, there is a twist, producing a rotational strain (Bond length may be slightly changed, however, it is a minor effect). The newly arrived silicon layer shares this rotational strain until enough silicon has been deposited. By then, most of the strain is pushed out of the silicon and concentrated in the SiO$_x$ layer in much the same way as the usual strain-layer epitaxy.

FIRST AND SECOND EMBODIMENT

Further, the invention includes a method of introducing other elements such as N, C, P, S, Sb, As, H, etc., which serve to replace oxygen for forming a barrier structure with silicon. Inclusion of different elements in place of or in addition to oxygen may also serve as a diffusion barrier in gettering, or trapping, other elements. In this regard, the Si/O superlattice and EpiSiO$_x$ may be reinforced by further diffusion of oxygen through the Si capping layer to be trapped by the barrier layers (Nakashima). The benefit is obvious: (a) the cap layer is epitaxial and defect free, serving as an ideal medium for FET devices, and (b) the epitaxial layer may be made thin enough itself to form barriers for quantum wells and for quantum devices such as the RTD, and quantum transistor and the single electron transistor.

This invention further provides a method to adjust (change) the dielectric constant and barrier height of the barrier layers, both Si/O and EpiSiO$_x$, by controlling the oxygen (or substitute element) content of the barrier. This can be accomplished by adjusting the level of oxygen during simultaneous deposition for EpiSiO$_x$ and controlling the percentage of monolayer oxygen coverage used in Si/O. In the EpiSiO$_x$ the oxygen can further be adjusted during deposition to produce a barrier with a controlled gradient of oxygen content across the barrier thickness. In Si/O this can be accomplished by repeating layers with varying oxygen exposure per layer. As we discussed before that the thicker the layer of epitaxially grown SiO$_x$, the thicker is the subsequent Si growth for fill recovery of epitaxy. Therefore, for thicker barrier requirements, we need to repeat the process, to build up the thickness of the barrier for a given application.

Both Si/O and EpiSiO$_x$ can be fabricated using Molecular Beam Epitaxy (MBE), and in some cases with Chemical Vapor Deposition (CVD) or by any other means known to those familiar with the state of the art.

Any of the above combinations of Si/O and/or EpiSiO$_x$, either individually or in multiple layers, will from hereon be referred to as said barrier.

This invention further provides a Silicon-on-Insulator (SOI) structure where said barrier is used as the insulator in the SOI with an epitaxial silicon device layer adjacent to this layer. This barrier layer can be used as is or can be enhanced by a high temperature oxidation procedure as described by Nakasbima et al.[21]

The invention provides for quantum devices where said barrier is used as a barrier with silicon to produce Resonant Tunneling Devices (RTD), (Silicon RTD has been experimentally realized by researchers in Inst. Of Semiconductor Physics, Kiev, Ukraine: Preliminary in Litovcheko et al., JVST, B15, 439 (1997)[8]), quantum well devices, single electron field effect transistors (SEFET), etc. It also provides a metal-oxide-semi-conductor field-effect transistor (MOSFET) where the gate "oxide" is replaced completely or partially by said barrier. Additionally, this just described MOSFET can have a layer of said barrier just below the channel region of the device to produce a true two dimensional electron gas between the source and drain thereby enhancing the mobility and performance of the device.

The main advantage of the present invention is that the said barrier allows for the continued epitaxial growth of silicon adjacent to this layer which is substantially defect free. This can be repeated to produce a stack of alternating said barrier and epitaxial device grade silicon in order to form a 3-dimensional structure for producing the 3-dimensional integrated circuits (3D-IC) of the future in silicon (see FIG. 7). This invention makes it possible to form the active channel, the contacts, and the insulating regions epitaxially. For example, the channel is made with epitaxial silicon on top of the EpiSiO$_x$ with the source and drain by conventional doping. The conventional n+ or p+ doping on top of an insulating layer serves as a gate (there is no need for polysilicon gate contact because the whole structure preserves epitaxy!) This 3D possibility using EpiSiO$_x$ propels the electronic industry into the 21$^{st}$ century!

An important aspect of the present invention is the possibility of building a 3D-IC of the future in silicon because all the components can now be built out of this epitaxial system forming barriers, channels, electrical insulation, etc. Such a 3D-IC can circumvent many problems of interconnection, heat dissipation and others. In the immediate future, a high speed, high efficiency, all silicon FET can be better designed with the EpiSiO$_x$.

FIG. 1A is a typical CMOS structure[26] while FIG. 1B is the same structure utilizing said barrier in an SOI approach. As a result, the individual devices are isolated from the substrate as well as each other eliminating the need for isolation wells, guard rings, etc.

Figure 2C:
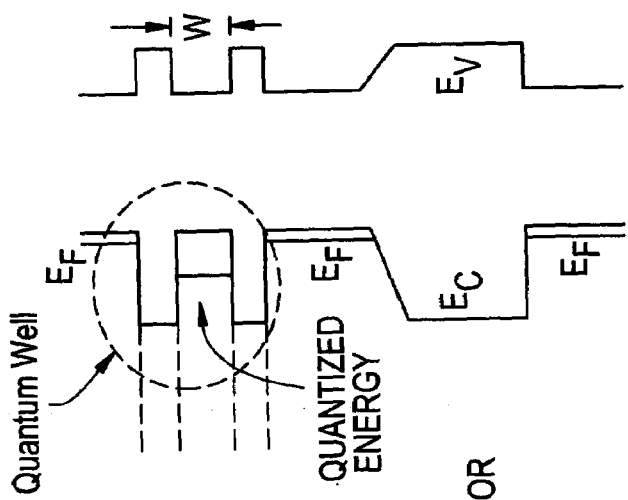
FIG. 2C is a schematic illustration of an energy band diagram for FIGS. 2A and 2B.
Figure 2B:
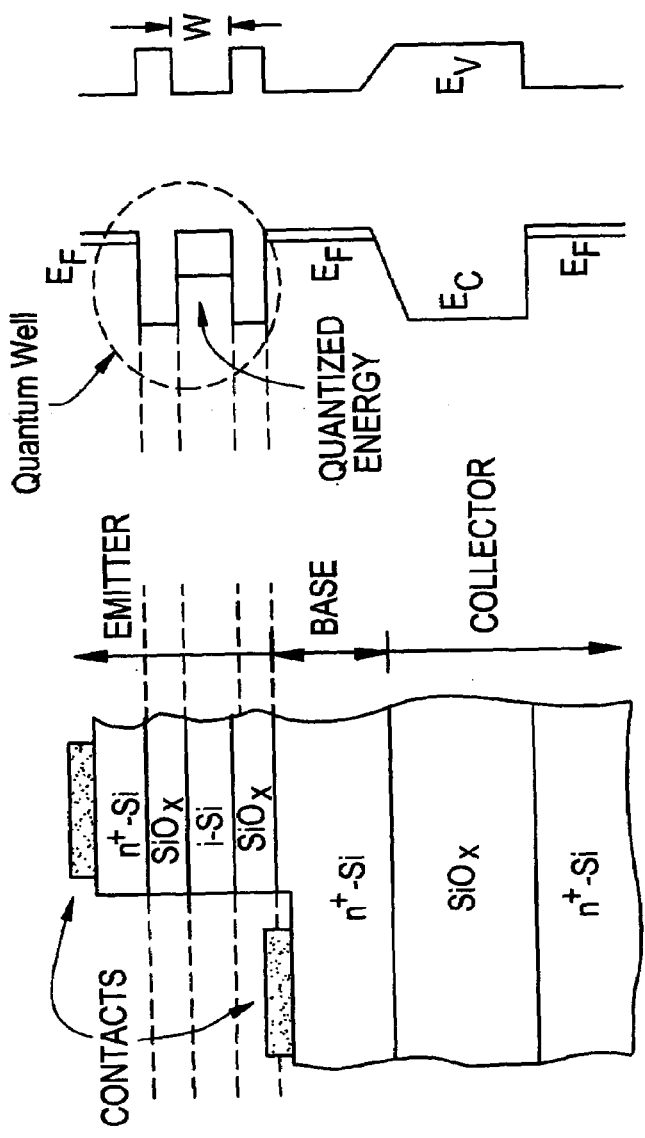
FIG. 2B is a schematic illustration of a RHET according to the present invention.
Figure 2A:
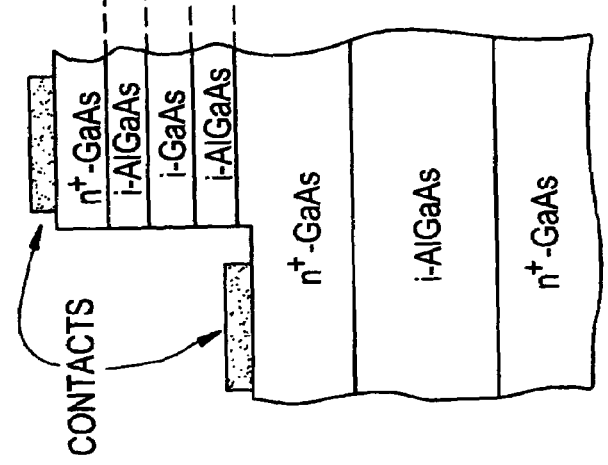
FIG. 2A is a schematic illustration of a known RHET.

FIG. 2A is an example of a quantum well structure device called a resonant-tunneling hot-electron transistor (RHET). FIG. 2A is a standard RHET device in Gallium Arsenide. FIG. 2B is the same structure applied to the present said barrier and silicon FIG. 2C shows the corresponding energy band diagram for these two structures identifying the quantum well region as part of the emitter for this device.[25]

Figure 3A:
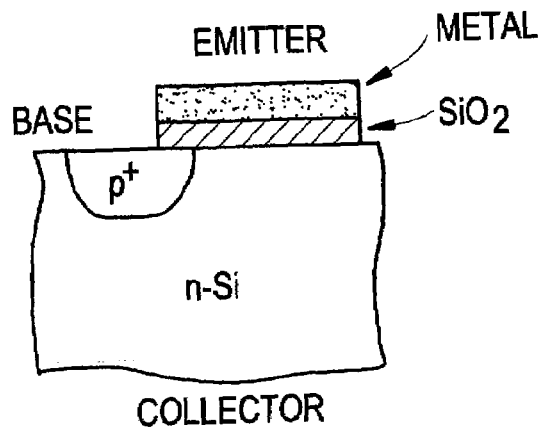
FIG. 3A is a schematic illustration of a known (MIS) TETRAN.
Figure 3B:
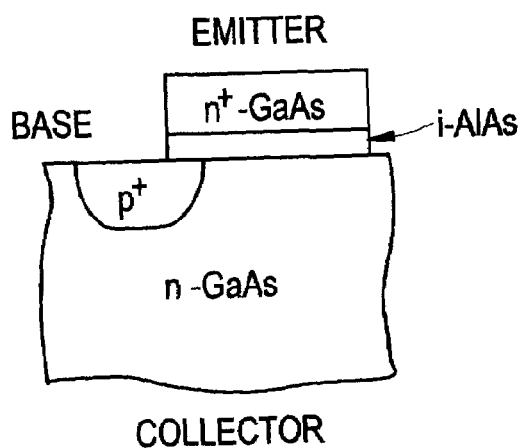
FIG. 3B is a schematic illustration of a known GaAs TETRAN.
Figure 3C:
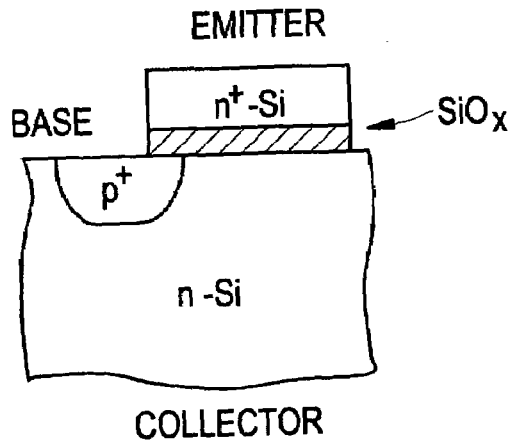
FIG. 3C is a schematic illustration of a TETRAN according to the present invention.

FIG. 3A illustrates a tunneling device called a Tunnel-emitter Transistor (TETRAN). FIG. 3A shows this device as a metal-insulator-semiconductor (MIS) TETRAN where electrons tunnel through the thin SiO$_2$ layer. FIG. 3B shows this same structure in GaAs where it would be more precisely referred to as a heterostructure TETRAN. Finally, FIG. 3C is this device where said barrier is substituted for the SiO$_2$ tunneling barrier of FIG. 3A (FIGS. 3A & 3B from ref. 25).

Figure 4:
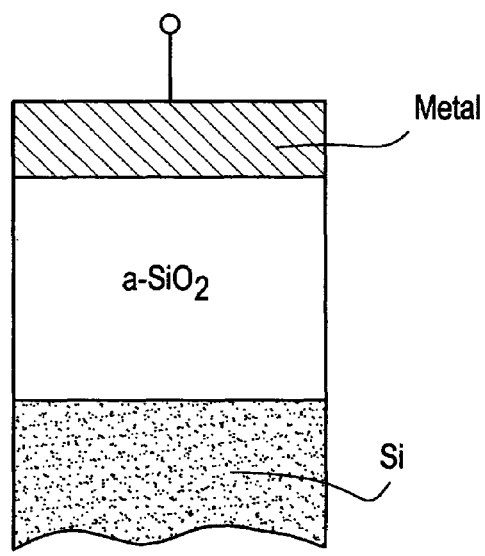
FIG. 4 is a schematic illustration of a known MOSFET.

FIG. 4 illustrates a conventional MOS structure as can be found in a Metal-oxide-semiconductor field-effect transistor (MOSFET) for example. This is typical of what is found between the gate and channel region of a MOSFET.

Figure 5:
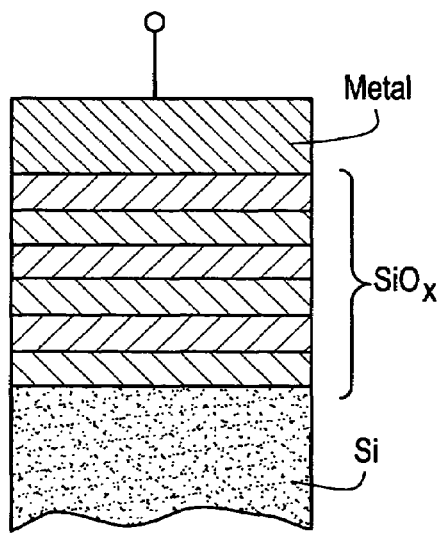
FIG. 5 is a schematic illustration of MOSFET according to the present invention

FIG. 5 illustrates a metal-said barrier -semiconductor structure. We will call this final device structure a metal-superlattice-semiconductor field-effect transistor MSLS-FET).

Figure 6:
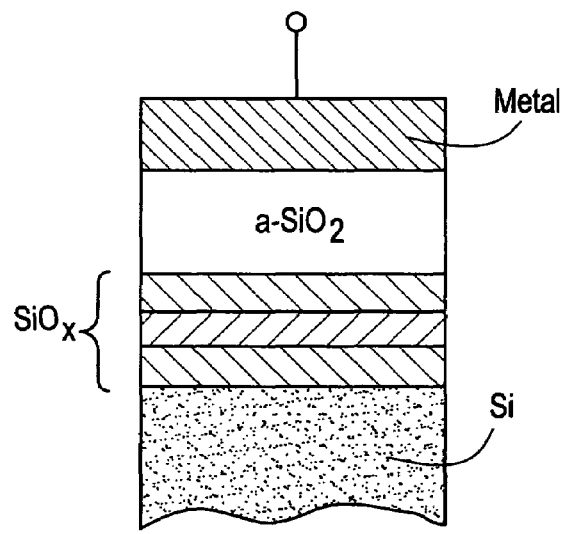
FIG. 6 is a schematic illustration of the gate region of a MOSFET according to the present invention
Figure 7:
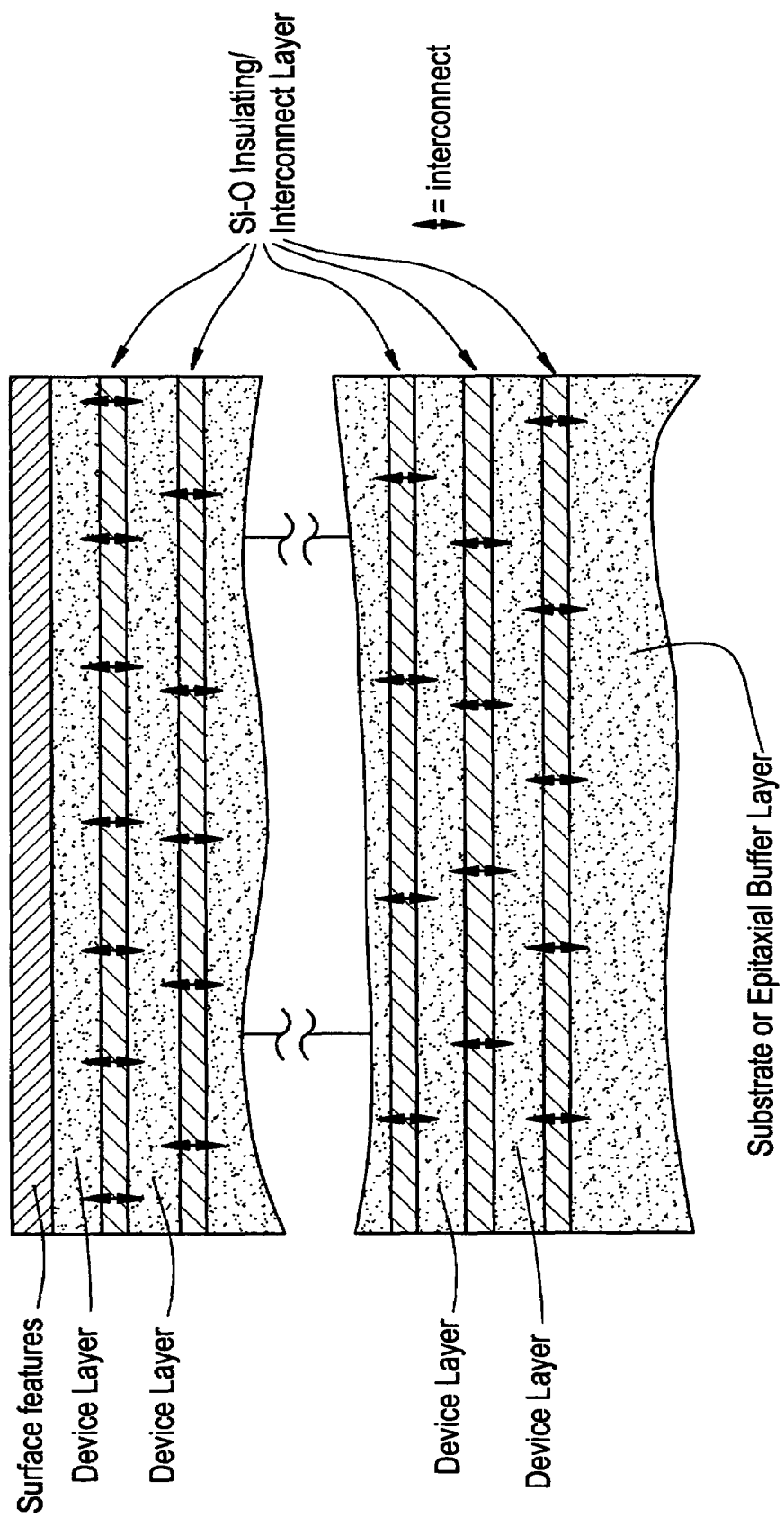
FIG. 7 is a schematic illusion of a portion of an IC according to the present invention.

FIG. 6 illustrates a metal—oxide/said barrier—semiconductor interface, as would be used in the gate region of a field-effect transistor. This provides an improved interface between the silicon and the gate insulation layer while allowing for a thick layer of $SiO_2$ as usually applied FIG. 7 illustrates a proposed 3-dimensional chip architecture using said barrier to isolate epitaxial device layers from one another while providing for localized interconnect between layers.

Figure 8:
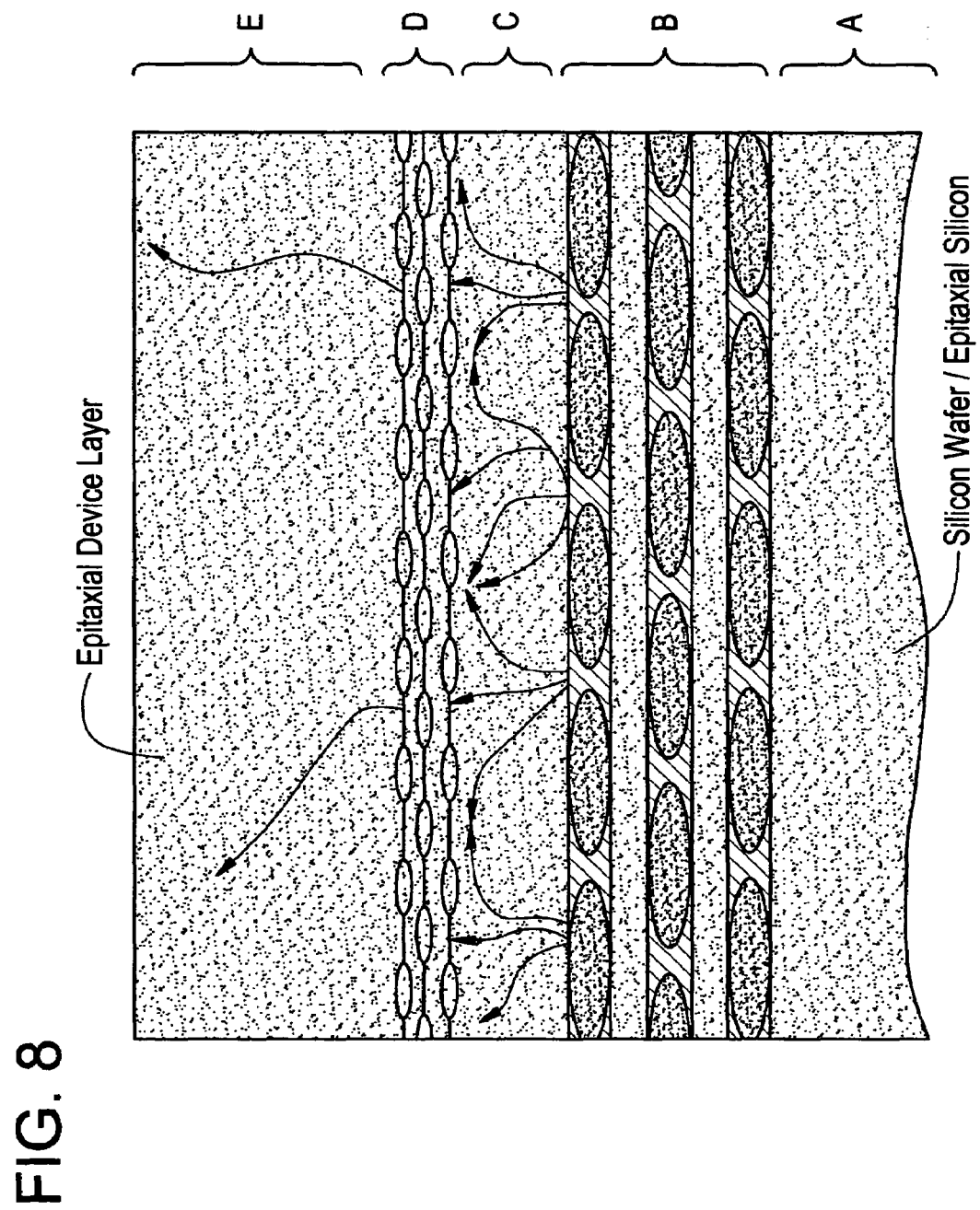
FIG. 8 is a schematic illustration of a composite structure according to the present invention.

FIG. 8 illustrates a proposed structure for very low defect epitaxial silicon (E) to be grown on top of an insulating layer (B) of the present invention which is in turn grown on a substrate of single crystal silicon (A). This approach uses multiple thin layers (13) of said barrier to reduce defect production in the total thickness of the insulating layer as opposed to one thick layer. A top "thin" reflection layer (D) of said barrier to further reduce the defects is included[13].

The preferred embodiments of the invention provide for four approaches to the structures for an insulating layer or barrier for use in semiconductor devices and methods for producing such structures:

(1) Si/O—A Si/absorbed-monolayer of oxygen next to a thin epitaxial layer of silicon is used as the building block of a barrier to form a repeatable system, a superlattice. Since all transport properties depend on both the barrier height and the barrier width, and since the barrier width is dictated by the Si—O—Si thickness which cannot be changed, the formation of a superlattice by repeating the basic building block accomplishes the desired thickness of the barrier. Relatively thick barriers are used as insulating devices including but not limited to SOI and thin barriers can be used in quantum devices.

(2) $EpiSiO_x$—A relatively thick $EpiSiO_x$ layer consisting of $SiO_x$ with x being typically approximately 1 but variable from >0 to 2 depending on application. This layer forms an epitaxial system on silicon on which epitaxial silicon, substantially free of defects such as stacking faults and dislocations can be (3) Superlattice of $EpiSiO_x$—A thin layer of $EpiSiO_x$ next to a thin layer of epitaxial silicon is used as the building block of a barrier to form a repeatable system, a superlattice. Since all transport properties depend on both the barrier height, which may be adjusted by controlling the oxygen content in the $EpiSiO_x$, and barrier width, and since the thickness of the $EpiSiO_x$ layer can be varied, the formation of a superlattice by repeating the basic building block accomplishes the desired thickness and characteristics of the barrier. Relatively thick barriers are used as insulating devices including but not limited to SOI and thin barriers can be used in quantum devices.

(4) Multiple layers of $EpiSiO_x$ with optional defect "reflection" layer—An insulating layer consisting of multiple layers of $EpiSiO_x$ and epitaxial silicon deposited onto a silicon substrate (or epitaxial silicon surface). On top of the last $EpiSiO_x$ layer a thick epitaxial device layer of silicon is deposited. This stacking of $EpiSiO_x$/epi-Si layers reduces the defect density generated in the final epitaxial device layer of silicon as a result of the "total" insulator layer. Additionally, any remaining defects can be further reduced by including a defect "reflection" layer of thin said barrier 30 to 50 nm up from the insulating layer capped off with an epitaxial device layer of silicon. As a result, the final layer of epitaxial silicon will show a significant reduction in the number of defects. This procedure has been the basis of the patents:

(a) Blakeslee et al., U.S. Pat. No. 4,088,515
(b) Blakeslee et al., U.S. Pat. No. 4,278,474.

In accordance with the related art (Nakashima et al, ref. 21) in semiconductor applications and specifically for SOI applications the concentration of oxygen in each of the $SiO_x$ layers can be increased by partially replacing oxygen with other elements including but not limited to C, N, P, Sb, or As. The elements can be introduced either during the oxygen deposition process, after the oxygen has been deposited, or later during the high temperature oxygen annealing step (described below and in ref 21) in accordance with methods well understood by those skilled in the art These elements act as traps, getters or diffusion barriers to trap extra oxygen in the oxide layer. Thereafter epitaxial silicon is deposited on the insulating oxide layer. In some applications, even when above stated trapping/getting/diffusion elements are not used, after the epitaxial silicon is deposited, the structure can be annealed in an oxygen atmosphere according to Nakashima, allowing additional oxygen to penetrate through the epitaxial silicon into the oxide layer without introducing excess defects in the epitaxial silicon. Typical annealing temperatures are 1300° C.[21]

(1) Si/O

The quantum electronic concept was introduced by Esaki and Tsu 27 years ago, [1,2] first in man-made compound semiconductors called "Superlattices" and three years later in resonant tunneling through quantum wells; These quantum devices require epitaxial barriers, usually fabricated from III–V, or II–VI compound semiconductors, since nearly matching the substrate lattice structures is important for the barrier formation. The lack of such a barrier in silicon has prevented the extension of quantum devices to silicon technology, and the search is on for a barrier for silicon. Said U.S. Pat. No. 5,216,262 (1993),[22] issued to R. Tsu described a method to build silicon-based quantum wells, with a superlattice barrier structure consisting of thin silicon layers sandwiched between monolayers of $SiO_2$.

In the present invention we have discovered a way to deposit and the resultant structure of a monolayer of absorbed oxygen which contains less oxygen than is contained in $SiO_2$. Oxygen is first introduced by absorption onto a clean silicon surface at temperatures up to 700° C. and high vacuum pressure ($<10^{-6}$ torr). Because the absorption process cannot exceed one monolayer under these controlled conditions, the method serves as a self-limiting process, ensuring the thickness of oxide at a monolayer, which is less than the amount of oxygen required to make a monolayer of $SiO_2$, thus allowing the continuation of the Si epitaxial growth. Our present results have been obtained by using standard MBE (Molecular Beam Epitaxy) monitored by RHEED (Reflection High Energy Electron Diffraction). The epitaxial silicon sandwiched between two absorbed monolayers of oxygen forms a unit, which can be repeated to give a superlattice structure. The barrier structure shows a barrier height of 0.5 eV, which is more than sufficient for most electronic and optoelectronic devices at room temperature. Current voltage measurements show the existence of a barrier, surface Auger shows the presence of oxygen where expected, and high resolution X-TEM (cross section transmission electron microscopy) shows almost defect free Epitaxy beyond the barrier layer. We name this system consisting of monolayers of absorbed oxygen sandwiched between thin epitaxially grown silicon layers HES (Hetero-Epilattice Superlattice).

It is an important observation that the epitaxial growth of silicon can indeed be continued. We have not established, however, if the continuation of epitaxy is because the absorbed oxygen provides less than full coverage, or because the oxygen at the interface forms a strain-layered oxide. If the coverage is not 100%, it is ntal that silicon can establish epitaxy. Alternatively, a monolayer with full coverage of oxygen should not totally mask the potential function presented by the substrate silicon surface, thus allowing the reestablishment of epitaxy. Our present data favor the latter possibility because we are able to bring back the epitaxial growth of silicon even after 100 L of oxygen (one L, Langmuir, is an exposure of oxygen at $10^{-8}$ Torr for 100 seconds). Although this theoretical issue is of a fundamental nature, the fact that a barrier forms regardless of the exact mechanism is the most important technical factor. More than twenty-five years ago, Distler, reported the oriented nucleation of gold on NaCi precoated with an amorphous carbon layer below a critical thickness. Subsequently, Henning confirmed Distler's observation that a sufficiently thin amorphous intermediate layer between substrate and deposit failed to inhibit epitaxy. Our verification of epitaxy substantially free from defects is based on in-situ RHEED and ex-situ X-TEM measurements.

Absorption of oxygen on a clean reconstructed surface does not have sufficient energy to overcome the 0.25–0.3 eV activation barrier for4 the transformation from a 2-dimensional silicon clean surface to a disturbed 3-dimensional silicon surface. Few observable changes in RHEED are seen in the reconstructed clean silicon surface except for a "fading" of the secondary lines as a result of dimerization of the surface silicon. However, once Si atoms arrive from the e-beam source, there is sufficient energy available to overcome the barrier resulting in a more 3D surface morphology. This is the reason why a minimum thickness of about 1 nm is needed for the silicon deposition to re-establish epitaxy.

(2) EpiSiO$_x$

Preferably a substrate of monocrystalline silicon is heated to a temperature of between 400° and 700° C. in a deposition chamber, preferably below 650° C. Silicon and an impurity element are simultaneously introduced into the chamber by any method generally known to those skilled in the art. In the preferred embodiment of the invention the impurity element is oxygen but other elements such as carbon and nitrogen as a pure gas or part of a gaseous compound which form an insulating barrier when combined with Si could be used. There are possible combinations of elements, which could be introduced to form such an insulating barrier as well, including but not limited to oxygen and carbon, carbon and hydrogen or oxygen and nitrogen.

Some deposition methods typically used are chemical vapor deposition, sputtering and molecular beam epitaxy. In the preferred embodiment, a layer EpiSiO$_x$ is deposited on a substrate of silicon (or alternately on epitaxial silicon) and the concentrations of silicon and oxygen adjusted until optimum concentrations allow for the deposition of substantially defect free epitaxial silicon on the layer of EpiSiO$_x$. The thickness of the insulating layer can be controlled by the time, deposition rate of silicon and temperature. The insulating properties of the barrier can be controlled by adjusting the amount of oxygen exposure. Once the preferred thickness of insulating barrier has been deposited, epitaxial silicon may be deposited on top of the insulating barrier producing a low defect layer of silicon for use in any of a number of methods used by those skilled in the art. Epitaxial silicon with less than $10^{11}$ defects per square centimeter can be grown on top of the insulating barrier, with typical defects of less than $10^{10}$ defects per square centimeter, providing device quality silicon on which to build conventional integrated circuits with significantly reduced leakage current, photoelectric devices of silicon or devices containing quantum wells of silicon.

In one embodiment of the invention the silicon is deposited by electron beam epitaxy and oxygen is simultaneously introduced into the chamber in concentrations high enough to provide a quality insulating layer but low enough to insure that the oxide layer is epitaxially grown. This is monitored by using RHEED to insure that the crystalline structure of the silicon substrate is maintained in the oxide layer. RHEED is used to adjust the oxygen pressure and the rate of deposition of silicon. When the concentration of oxygen is too high or the deposition rate of silicon too slow, the RHEED pattern changes to indicate a reduction of quality of the subsequent surface from what is necessary to continue high quality epitaxial growth of silicon The rate of silicon deposition can be measured with a 6 megahertz oscillating silicon crystal or any of a number of different methods. Typically oxygen pressure is $10^{-6}$ Torr, but it could be done with other higher and lower oxygen pressures. Typical electron beam epitaxy silicon deposition rates are 0.4 A/s using molecular beam deposition but these rates will vary depending on the process used. Chemical vapor deposition is one of a number of alternative methods of depositing the silicon and oxygen.

Typically the silicon substrate, on which the barrier is deposited, is kept at temperatures of 400° to 700° C. in a vacuum chamber typically kept at a pressure of $10^{-6}$ Torr or less background pressure, however depending on the specific element introduced to form the insulating barrier these values will change.

Although the preferred embodiments of the present invention are described herein with oxygen as the element bonding to silicon to form an insulating layer, as will be recognized by those skilled in the pertinent art, this invention includes other elements to be bonded with silicon to form said insulating layer. In addition although details of the molecular beam epitaxy system used to prepare the insulating layer are described herein, as will be recognized by those skilled in the pertinent art this invention includes other methods of depositing silicon with at least one other element in a way to form an insulating barrier.

(3) Superlattice of EpiSiO$_x$

In a method as described in (2) above a very thin layer of EpiSiO$_x$ is deposited on a monocrystalline silicon substrate or on epitaxial silicon. A thin layer of epitaxial silicon is deposited next to the first EpiSiO$_x$ layer, which forms a building block for generating a superlattice of alternating layers of EpiSiO$_x$ and epitaxial silicon. The resultant structure has many applications in semiconductor devices.

(4) Multiple Layers of EpiSiO$_x$ with Optional Defect "Reflection" Layer

FIG. 8 shows one of the preferred embodiments of the current invention. There is evidence that the thicker the layer of EpiSiO$_x$ the higher the number of dislocations in the epitaxial silicon above it. It is therefore another aspect of this invention to decrease the number of defects in the top layer (see FIG. 8) of epitaxial silicon by using multiple thin layers of EpiSiO$_x$ in place of one thick layer of EpiSiO$_x$. The thinner the layer of EpiSiO$_x$, the faster that the surface quality can be recovered In FIG. 8 thicknesses of 25 Angstroms separated by epitaxial layers of 100 Angstroms are shown for the preferred embodiment, but these thicknesses may vary. Thus by using multiple layers, the number of defects in the final top epi-layer can be reduced.

Even with such thin layers of EpiSiO$_x$ sandwiched between epitaxial silicon, there will be some dislocations, which are manifested in the layer of epitaxial silicon grown on top of the last EpiSiO$_x$ layer. It is a further optional disclosure of this invention to place an additional thick layer of epitaxial silicon (typically 300 to 500 angstroms as shown in FIG. 8) on top of the last EpiSiO$_x$ layer. By capping this thicker layer of silicon with a very thin layer (or series of layers sandwiched between thin layers of epitaxial silicon) of either EpiSiO$_x$ or an absorbed oxygen monolayer, there is sufficient space to allow threading dislocations to be deflected and terminated inside this thick layer of silicon[13], significantly reducing the number of defects in the top layer of epitaxial silicon (see FIG. 8).

In preferred embodiments of the invention a quantum well consists of mono-crystalline silicon epitaxially grown between two said barrier sections. The barrier section consists of a region of alternate thin layers of Si and an oxygen enriched layer of Si (either EpiSiO$_x$ with 0>x>2.0 or a monolayer of oxygen). This structure exhibits all of the quantum confinement effects and is fully compatible with silicon technology.

In a preferred embodiment of the present invention, the quantum well structure for semiconducting devices comprises: first and second barrier regions each consisting of alternate layers of said barrier with thicknesses so thin that no defects can be generated as a result of the release of stored strain energy. This thickness is generally in the range of 2 to 4 monolayers. A much thicker section of pure silicon is sandwiched between this barrier regions service as quantum confinement of carriers. Note that the proposed barriers can also serve to confine the holes in the valence band. Doping either with modulation doping, i.e. only in the silicon layers in the barrier region or involving also the well region may be incorporated to form desired junction characteristics. Hydrogen may also be used to passivate some of the residual defects if necessary.

In a preferred embodiment of the invention, 3-dimensional IC devices can be constructed using said barrier between epitaxial layer of device grade silicon. IC devices are constructed in the individual silicon layers, which are connected within the layers and between the layers. FIG. 7 shows a schematic illustration of how an insulating layer so deposited allows for epitaxial silicon to be grown on top of the insulator. The epitaxial silicon becomes the substrate for a new layer of IC devices, thus creating a three-dimensional integrated circuit. Interconnections between one layer and the next can be done in any of a number of ways which might include appropriate doping, such as n+, of the epitaxial silicon to form conducting regions from one level of ICs to the next.

Figure 1A:
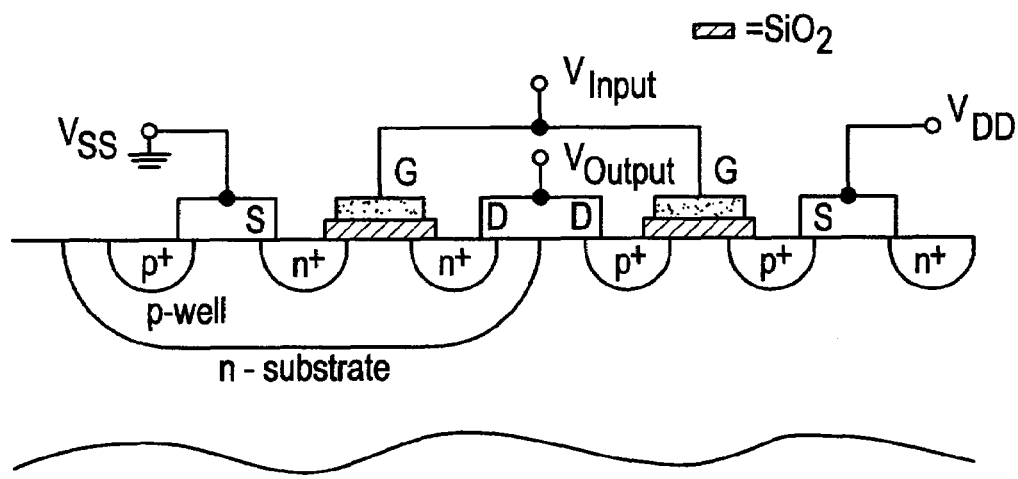
FIG. 1A is a diagrammatic illustration of a known CMOS.
Figure 1B:
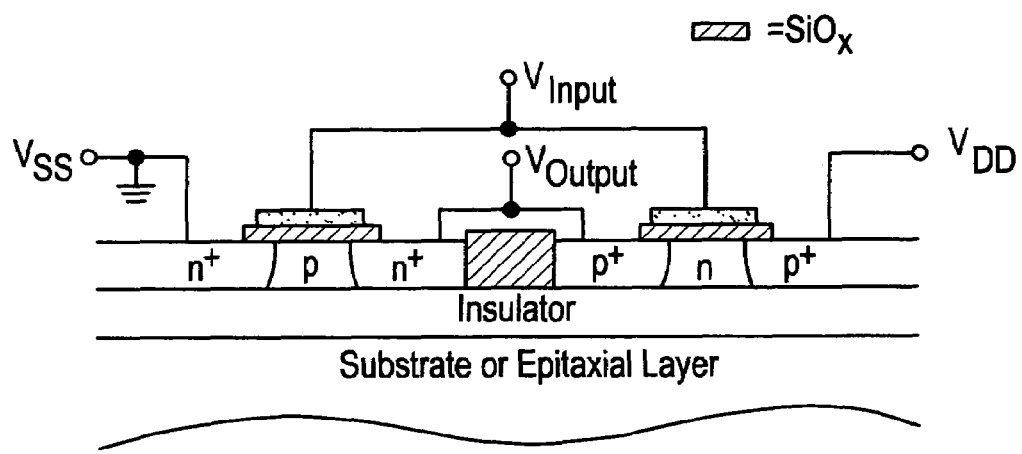
FIG. 1B is a diagrammatic illustration of a CMOS according to the present invention.

Examples of how said barrier can be used in some typical devices are shown in FIG. 1B. In the drawings which show SiO$_x$ as the replacement insulating layer it should be understood that SiO$_x$ represents said barrier on the specific application. In addition FIG. 1 schematically illustrates how an SOI (said barrier shown as Insulator) layer can be typically used in a CMOS Inverter application. Anyone skilled in the art will know how to use the insulating layers disclosed in this invention to extend the applications to other semiconductor devices.

The silicon MOSFET (FIG. 4) is probably the most important solid state electronic device. The oxide, amorphous SiO$_2$, is sandwiched between a metal gate contact and silicon channel region of the device. The lower the interface defect density between the SiO$_2$ and silicon, the faster the switching speed. The replacement of the amorphous SiO$_2$ by said barrier described in this invention can reduce the interface defect density between the silicon and the insulator. To be more precise, as shown in FIG. 5, the amorphous SiO$_2$ serving as the insulating layer between the metal gate and the silicon is now replaced with said barrier. Alternatively, as shown in FIG. 6, a layer of SiO$_2$ can be used between the top layer of said barrier and the metal gate. In this configuration there will still be defects at the interface with SiO$_2$ but now these defects are located away from the silicon, consequently not effecting the switching performance. Conventional epitaxial silicon growth techniques such as VPE (vapor phase epitaxy) with the use of gaseous sources such as SiH$_4$, MBE (molecular beam epitaxy), sputtering, and CBE (chemical beam epitaxy) may be used to fabricate such structures.

The invention claimed is:

1. A barrier composite useful for semiconductor devices, comprising an insulating layer of silicon and at least one additional element deposited on a silicon substrate whereby said insulating layer is substantially free of defects, and having a deposit of epitaxial silicon substantially free of defects deposited on said insulating layer, wherein said insulating layer comprises SiOx wherein O<x<2.0 and the surface of said silicon substrate is epitaxial.

2. A barrier composite according to claim 1, wherein said insulating layer comprises at least a second additional element selected from the group consisting of carbon, nitrogen, phosphorus, sulfur, hydrogen, antimony and arsenic, and combinations thereof.

3. A barrier composite according to claim 1, wherein said insulating layer is essentially epitaxial.

4. A barrier composite according to claim 1, comprising a plurality of insulating layers forming a barrier comprising a plurality of insulating layers sandwiched between epitaxial silicon.

5. A barrier composite according to claim 4, wherein said additional elements comprise oxygen and at least one other of said additional elements.

6. A semiconductor device comprising a barrier composite, said barrier composite comprising an insulating layer of silicon and at least one additional element deposited on a silicon substrate whereby said insulating layer is substantially free of defects, and said composite having a deposit of epitaxial silicon substantially free of defects deposited on said insulating layer, wherein said insulating layer comprises SiOx wherein O<x<2.0 and the surface of said silicon substrate is epitaxial.

7. A semiconductor device according to claim 6, wherein said insulating layer comprises at least a second additional element selected from the group consisting of carbon, nitrogen, phosphorus, sulfur, hydrogen, antimony and arsenic, and combinations thereof.

8. A semiconductor device according to claim 6, wherein said insulating layer is essentially epitaxial.

9. A semiconductor device according to claim 6, comprising a plurality of insulating layers forming a barrier comprising a plurality of insulating layers sandwiched between epitaxial silicon.

10. A semiconductor device according to claim 9, wherein said additional elements comprise oxygen and at least one other of said additional elements.

11. A semiconductor device according to claim 6, wherein said semiconductor device comprises a structure selected from the group comprising resonant tunneling devices, single electron field effect transistors, quantum well devices, metal oxide semiconductor field effect transistors and integrated circuit devices.

12. A method for producing an insulating or barrier layer, useful for semiconductor devices, on a silicon substrate, which comprises absorbing on said silicon substrate one or more elements to form a monolayer of said element or elements, onto which is grown epitaxial silicon, wherein said insulating layer comprises SiOx wherein O <x<2.0 and the surface of said silicon substrate is epitaxial.

13. A method according to claim 12, wherein said elements comprise oxygen and at least a second additional element selected from the group consisting of carbon, nitrogen, phosphorus, antimony and arsenic, and combinations thereof.

14. A method according to claim 13, wherein a plurality of insulating layers are deposited to form a barrier comprising a plurality of insulating layers sandwiched between epitaxial silicon.

15. A semiconductor device comprising a barrier as defined in claim 14.

16. A semiconductor device according to claim 15, wherein said semiconductor device comprises a structure selected from the group comprising resonant tunneling devices, single electron field effect transistors, quantum well devices, metal oxide semiconductor field effect transistors and integrated circuit devices.

* * * * *